United States Patent
Huang et al.

[11] Patent Number: 6,110,816
[45] Date of Patent: Aug. 29, 2000

[54] METHOD FOR IMPROVING BONDABILITY FOR DEEP-SUBMICRON INTEGRATED CIRCUIT PACKAGE

[75] Inventors: Yung-Sheng Huang; Hung-Chang Hsieh; Han-Chang Hsieh, all of Hsin-Chu, Taiwan

[73] Assignee: Taiwan Semiconductor Manufacturing Company, Hsin-Chu, Taiwan

[21] Appl. No.: 09/261,999

[22] Filed: Mar. 5, 1999

[51] Int. Cl.$^7$ ................................................. H01L 21/44
[52] U.S. Cl. ........................... 438/612; 438/613; 438/614; 438/617; 438/622; 438/637
[58] Field of Search ................................ 438/612, 613, 438/614, 617, 622, 637, 666, 611, 638, 639, 640, 672

[56] References Cited

U.S. PATENT DOCUMENTS

| | | | |
|---|---|---|---|
| 5,461,008 | 10/1995 | Sutherland et al. | 438/460 |
| 5,487,999 | 1/1996 | Farnworth | 438/17 |
| 5,545,589 | 8/1996 | Tomura et al. | 438/119 |
| 5,661,081 | 8/1997 | Hsue et al. | 438/106 |
| 5,700,735 | 12/1997 | Shiue et al. | 438/612 |
| 5,834,365 | 11/1998 | Min-Tung et al. | 438/612 |
| 5,861,344 | 1/1999 | Roberts et al. | 438/738 |
| 5,937,326 | 8/1999 | Cho | 438/669 |
| 5,963,831 | 10/1999 | Fu | 438/666 |

*Primary Examiner*—Olik Chaudhuri
*Assistant Examiner*—Alonzo Chambliss
*Attorney, Agent, or Firm*—George O. Saile; Stephen B. Ackerman

[57] ABSTRACT

A method is adapted to form wire interconnect pads on integrated circuit devices and includes the steps of providing a semiconductor substrate having an aluminum-copper top metal layer, and a titanium nitride layer covering the aluminum-copper top metal layer, and a photoresist coating applied to the titanium nitride layer. The photoresist coating is partially exposed and partially developed to form openings for etching an array of submicron size holes. Etching through the titanium nitride layer to the aluminum-copper layer, by way of the partially developed photoresist, forms a rough textured surface profile in the array of cavities, with diameters of less than 0.3 um, etched in the aluminum copper layer. After stripping of the photoresist and depositing a passivation film, windows are formed delineating improved bond pads for wire bonding. The textured cavities increase the surface area of the bond pads and provide improved bondability for the 0.35 and 0.3 um IC devices.

9 Claims, 3 Drawing Sheets

METHOD FOR IMPROVING BONDABILITY FOR DEEP-SUBMICRON INTEGRATED CIRCUIT PACKAGE

TECHNICAL FIELD

This invention relates generally to a method for making integrated circuits and more particularly, the invention relates to methods that improve the bondability for deep-submicron integrated circuit package connections.

DESCRIPTION OF THE PRIOR ART

The following three documents relate to methods dealing with the roughing of a surface to improve bondability.

U.S. Pat. No. 5,545,589 issued Aug. 13, 1996 to Y. Tomura et al., discloses a bump having a rugged side formed by an abrasive grinding process.

U.S. Pat. No. 5,487,999 issued Jan. 30, 1996 to W. Farnworth discloses a method for forming contacts on a semiconductor die. Each contact includes a rough textured surface having asperities adapted to penetrate the contact location on the die to a limited penetration depth. The height of the asperities is between 1000 A to 10,000 A. The textured surface and asperities are formed by etching a surface of a raised metal contact.

U.S. Pat. No. 5,461,008 issued Oct. 14, 1995 to R. Sutherland et al., discloses a method of suppressing adherence of silicon particles to IC bond pads, and corrosion thereof, during the dicing of silicon wafers by sawing. An anion of an organic acid is added to saw coolant water.

The packaging technologies that span the microelectronics industry from consumer electronics to low-end systems to high-performance systems are very diverse. The number of chips needed to form a system in the past increased from a few, in consumer electronics, to several thousands, in supercomputers. Given this, the packaging hierarchical technologies necessary to interconnect all these chips became complex; consumer electronics typically required a card or flexible-circuit carrier, and supercomputers required several boards, each containing several cards of multi-chip modules (MCMs).

Unpackaged or bare semiconductor dice are being increasingly used in the manufacture of electronic devices that employ MCM. These unpackaged dice are mounted directly to a substrate such as a printed circuit board. Although the MCM approach had been the technology of choice for the mainframes, its use in PCs is still emerging. A multichip approach seems the only practical choice when heterogeneous semiconductors are a necessity. Thus, there is a strong drive for dense, low cost interconnections capable of providing high degree of electromagnetic separation between the digital and RF signal and power interconnections. Yet another set of challenges stems from distributed computing (actually data processing) with its need for rapid and faultless transmission of enormously large data/information volumes.

Objectives of the electrical package design are to assure reliable and predictable signal transmission through the on-chip and off-chip interconnections. This is accomplished by numerous design considerations, all of which have to be met. Several of the key objectives are: To assure reliable functioning of the interchip signal interconnections (nets); to assure reliable on-chip nets performance; to optimize the packaging cross-sectional geometries and, if possible, materials; and to devise and verify "wiring rules".

These objectives were pioneered by the developers of packaged electronics for the mainframes and supercomputers; now they are becoming increasingly pervasive for the entire range of digital processors, because their clock frequencies are going well beyond the 300 MHz range. The demand for higher performance had been driving down the overall dimensions of a computer while demanding more circuits and more bits of storage. The higher level of IC integration enables such size reductions, however, poor bondabilities are presently found on 0.35 um and 0.3 um packages.

SUMMARY OF THE INVENTION

Wirebonding has totally redeemed itself in reliability, manufacturability, and cost from where it was in the earliest era of semiconductor devices. It is still the dominant chip-connection technology in the semiconductor industry. Therefore, because the vast majority of all integrated circuit (IC) packages are assembled by wirebonding, it is important to understand this technology.

Wirebonding is popular as a result of continuous process improvement achieved through the development of sophisticated, automated equipment. Today's production lines can assemble the latest generation of packages with the evolutionary derivative of the welding technique used to manufacture the first transistor.

Today, hundreds of diverse plastic and ceramic packages utilize wirebonding. Despite this diversity, commonalities do exist. The wires are attached to the chip and package substrate, one at a time, using either a thermosonic or ultrasonic process. State of the art bonding technology produces two welds and a precisely shaped/routed wire loop in 100–125 ms, depending on the process used.

Most wirebonding processes combine either thermosonic (T/S) or ultrasonic (U/S) welding methods, with two different bonding methods for applying the wire to the chip and to the package surfaces. The two basic wirebonding techniques are ball bonding and wedge bonding. Approximately 93% of all semiconductor packages are manufactured using ball bonding method, while wedge bonding is used to produce about 5% percent of all assembled packages. A third method, thermocompression welding, may be used, but is not commonly used.

In ball bonding, wire is fed vertically, through a tool called a capillary. The wire is heated to a liquid state with an electronic spark discharge called an electronic flame-off (EFO). The surface tension of the molten metal forms a spherical shape, or ball, as the wire material solidifies, hence the process name "ball bonding".

In accordance with the present invention, a method for forming a top metal layer to improve interconnect bondability for deep-submicron integrated circuit packages is provided.

A semiconductor integrated circuit structure includes a semiconductor substrate with deep-submicron electronic elements formed therein. The present invention is concerned with improvements to interface bonding between a top metal (Al Cu) layer of an integrated circuit structure and an interconnect wire. The improved bonding surface has an increased surface area with an enhanced surface profile for increasing a wire's mechanical bond and tensile strength.

Accordingly, it is an object of the present invention to provide a method for forming an improved interface structure for bonding an interconnect member to enhance electrical contact on a deep-submicron integrated circuit package.

It is another object of the present invention to increase the area of the bonding interface structure to improve its mechanical bond and tensile strength.

It is yet another object of the present invention to improve the surface profile of the bonding interface structure to further improve interconnect bondability.

It is yet another object of the present invention to provide a method for forming an improved interface structure for bonding an interconnect member that does not require additional cost or process steps.

It is an additional object of the present invention to provide the method useful in a semiconductor device having large scale integration.

Based on the intensive and thorough research and study by the present inventors, the above objects can be accomplished. In accordance with these aims and aspects, the present invention provides a method for processing and forming integrated circuits on a wafer which is to have an array of deep-submicron integrated circuit dice with improved bonding interfaces.

DESCRIPTION OF THE DRAWINGS

FIG. 3b is a partial and exploded view of the cross section of a dimension reduced etched hole on a bond pad of the top metal as illustrated in FIG. 3a.

DETAILED DESCRIPTION OF THE PREFERRED EMBODIMENT

The method of the invention is adapted to form an interconnect structure and includes the following sequence. Providing a semiconductor substrate having a customary aluminum-copper top metal layer, and a customary titanium nitride layer covering the aluminum-copper top metal layer, and a customary photoresist coating applied to the titanium nitride layer. The photoresist coating is exposed using a photomask to provide an array of reduced diameter holes in the photoresist after the resist is developed. Openings are etched in and through the titanium nitride to the aluminum-copper layer thus forming a rough textured surface profile in the top aluminum-copper layer through the openings of the titanium nitride. A passivation film is deposited therethrough thus forming windows for wire bonding.

Figure 1:
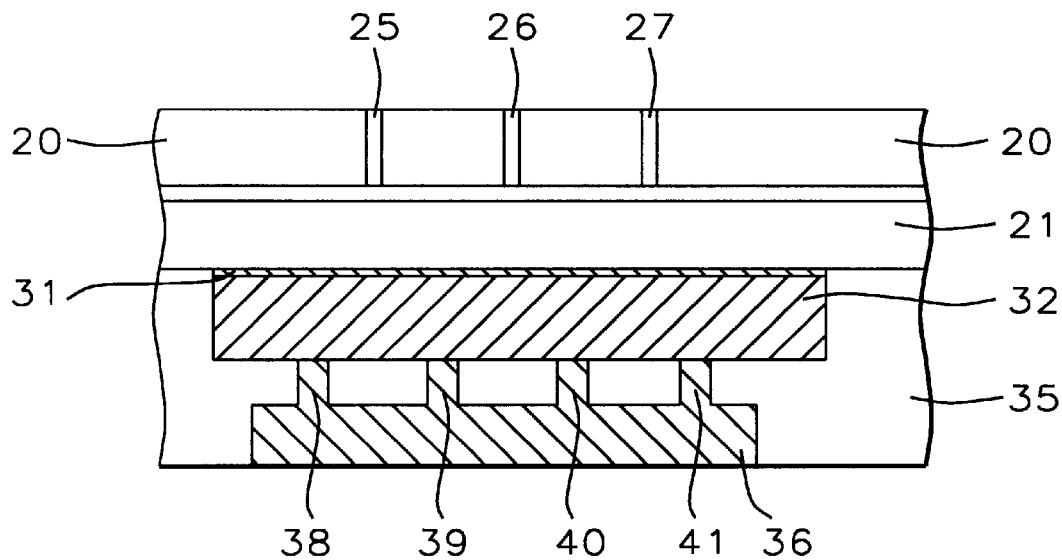
FIG. 1 is a schematic cross sectional drawing illustrating a photomask for exposing a pbotoresist applied to a semiconductor substrate in preparation for forming interconnect bonding surfaces in accordance with the method of the invention.
Figure 2:
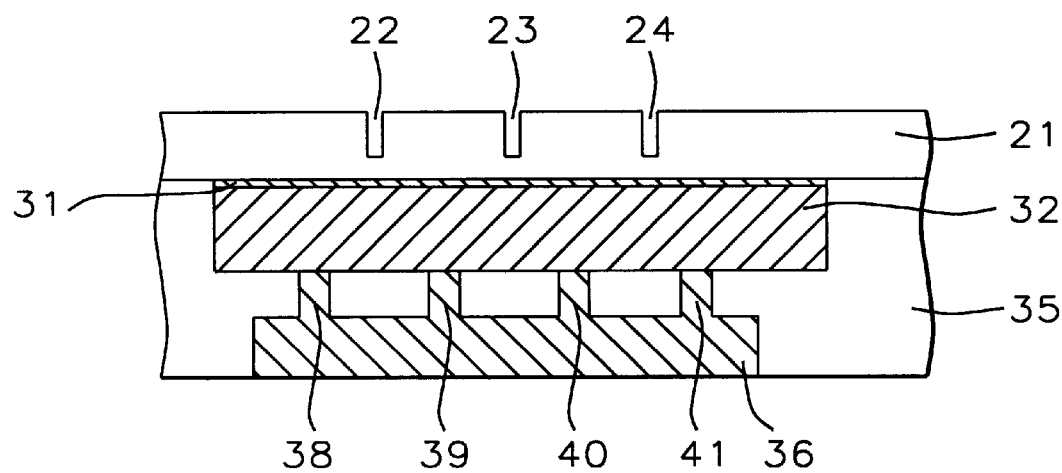
FIG. 2 is a schematic cross sectional drawing illustrating the exposed and developed portion of the photoresist in accordance with the method of the invention.

Referring now to FIGS. 1 through 5, the above identified method is illustrated in schematic form. In FIG. 1, a substrate 35 with a coating of photoresist 21 is provided. The coating of photoresist 21 masks an underlayer of titanium nitride 31 deposited over a top aluminum-copper layer 32 that forms an electrical connection with a base metal layer 36 through the sectioned patterned holes 38, 39, 40, 41. A photomask 20 having a multiplicity of dimensionally reduced holes 25, 26, 27 (shown in cross-section), of less than 0.3 um diameter, is used to partially expose the photoresist within the bonding pad areas of the semiconductor devices. FIG. 2 illustrates the partially exposed and developed pattern of holes 22, 23, and 24 shown in cross-section in the photoresist 21. After the partial development of the photoresist, the semiconductor substrate is prepared for etching.

Figure 3A:
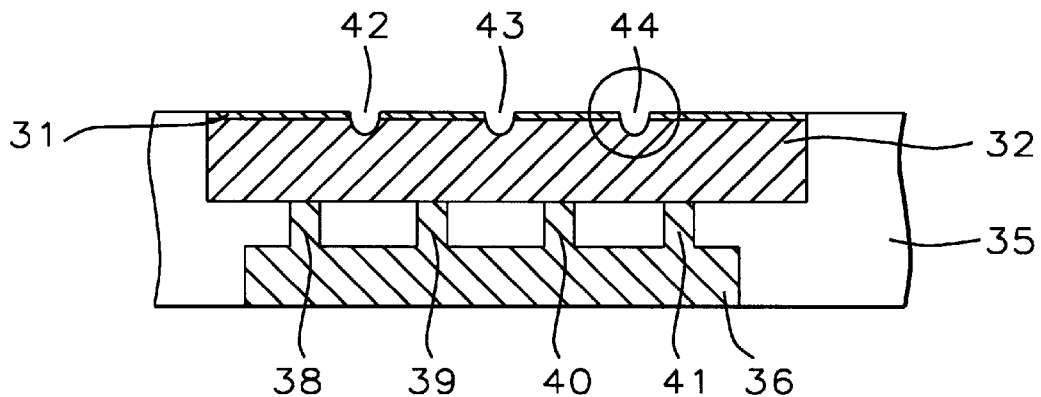
FIG. 3a is a schematic cross sectional drawing illustrating the results of an etching process in accordance with the method of the invention.
Figure 3B:
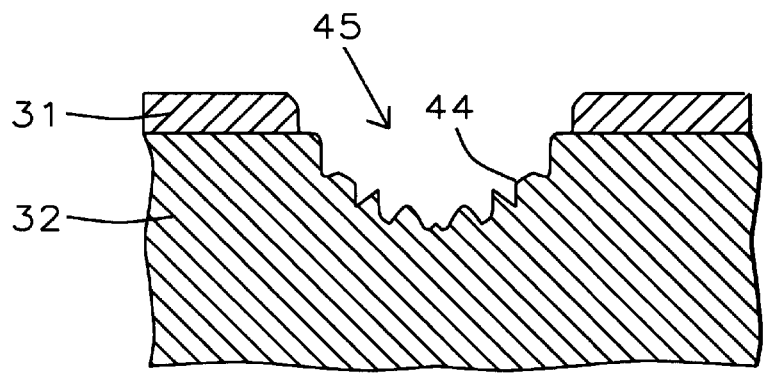
Figure 3C:
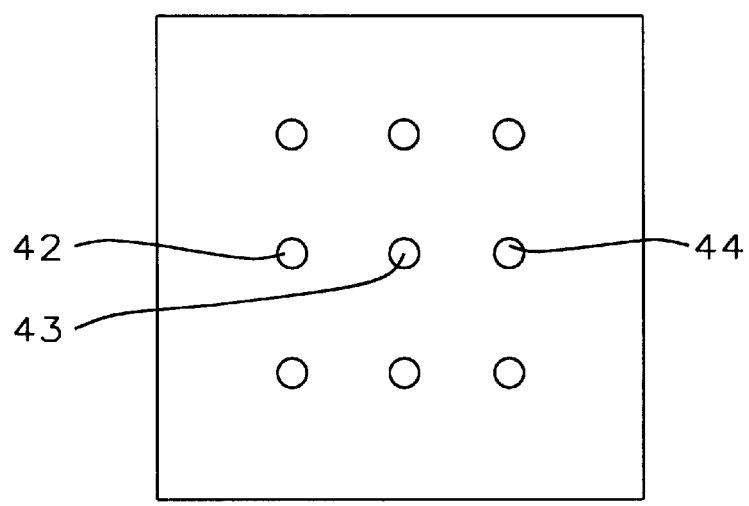
FIG. 3c is a top schematic view showing a typical etched hole array of the invention.

Next, as shown in FIG. 3a, after etching of the pattered substrate, the photoresist is stripped from the substrate displaying the etched boles 42, 43, 44, shown in cross-section, as etched through the titanium nitride 31 forming a rough textured and semi-ellipsoidal profile 45 in the top aluminum-copper layer. This can interconnect wire member to this prepared bond site. The asperities act as energy directors during bonding, particularly during ultrasonic bonding, a popular method of wire bonding. The partial and exploded view of FIG. 3b best illustrates the semi-ellipsoidal profile and FIG. 3c shows a top view of a typical hole array within an interconnect bond site of the invention.

Figure 4:
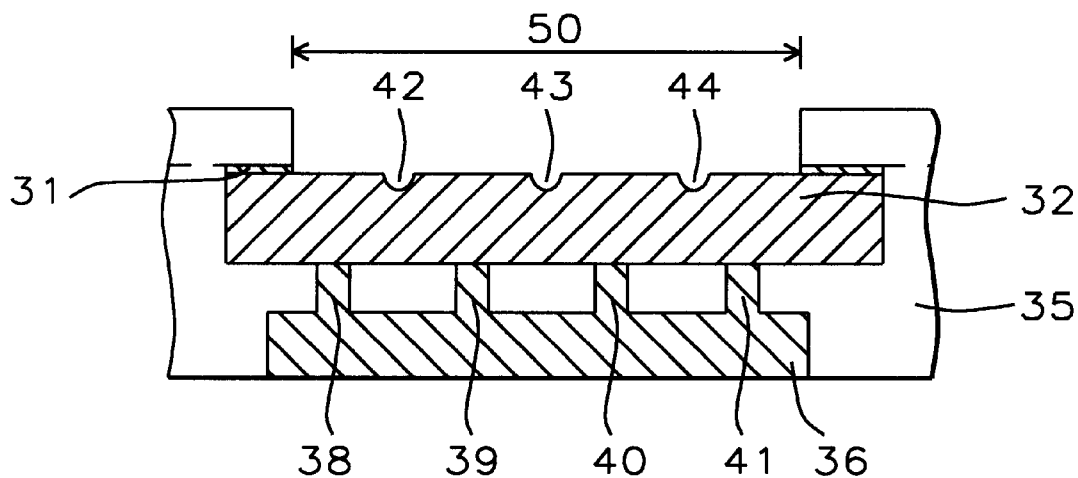
FIG. 4 illustrates a typical prepared bond site of the invention.
Figure 5:
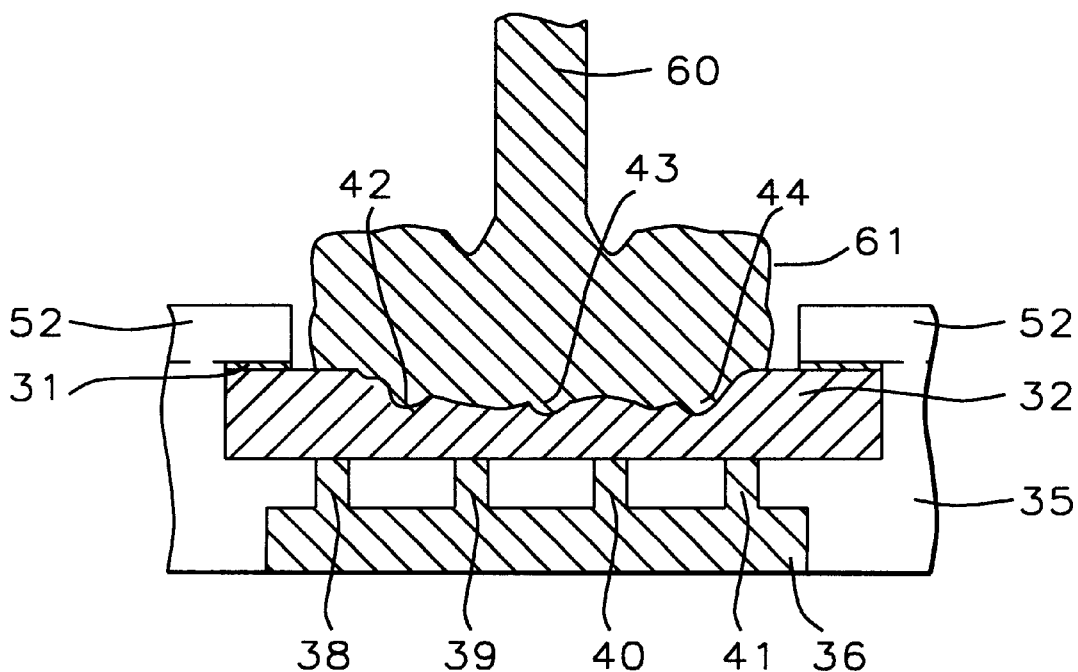
FIG. 5 is a schematic cross sectional drawing, of the invention, illustrating the bonding interface between the prepared bond site and an interconnect wire after wire bonding.

Referring now to FIG. 4, the titanium nitride layer 31 is stripped within a photolithographically defined bond area 50. A chip passivation layer 52 usually made of glass films, such as silica ($SiO_2$), phosphosilicate glass, silicon dioxide or a likeness thereof, is deposited on the substrate while the bond sites are masked with a photo-resist. The photo-resist is stripped after passivation leaving an open bond site for bonding the interconnect wire member to the open bond site.

In FIG. 5A, a wire member 60 is placed in position and directed to the center of the bonding site 50. In ball bonding, wire member 60 is fed vertically, through a tool called a capillary (not shown). The wire member 60 is heated to a liquid state with an electronic spark discharge (not shown) called an electronic flame-off. The surface tension of the molten metal forms a spherical shape, or ball 61, as the wire material solidifies, hence the process name "ball bonding". The downward forces for ball bonds are well under 100 g. This low force means that the capillary tool's vertical motion will "stall" and the bond squash will reach an equilibrium state before it is totally flattened. The partially deformed ball is now ready for the ultrasonic welding process because it is physically wetted to the aluminum bond pad. During welding, the pliable metal ball fills the rough textured semi-ellipsoidal cavities 42, 43, 44 so there is an added surface area for joining and intermetallic diffusion.

While the invention has been particularly shown and described with reference to the preferred embodiments thereof, it will be understood by those skilled in the art that various changes in form and details may be made without departing from the spirit and scope of the invention.

What is claimed is:

1. A method for forming a wire ball bonding surface site on a semiconductor die comprising the steps of:

providing a semiconductor substrate having a top electrically conducting layer, and an overlying layer covering said top electrically conducting layer, and a photoresist applied to said overlying layer;

patterning said photoresist to form an array of submicron size holes;

etching openings through said overlying layer to said top electrically conducting layer, and forming a rough textured surface profile in said top electrically conducting layer through said openings of said overlying layer;

depositing a passivation film over said overlying layer and forming wiring pad windows for wire ball bonding.

2. The method of claim 1 wherein said overlying layer is titanium nitride.

3. The method of claim 1 wherein said top electrically conducting layer is aluminum-copper.

4. The method of claim 1 wherein patterning said photoresist coating is accomplished using a photomask having a plurality of hole arrays with submicron hole diameters.

5. The method of claim 1 wherein patterning of said photoresist to form a plurality of hole arrays, said patterning is done by partially exposing and partially developing of said photoresist.

6. The method of claim 5 wherein etching of said submicron size holes through said partially exposed and partially developed photoresist produces etched hole diameters of less than 0.3 um.

7. The method of claim 5 wherein etching of said submicron size holes through said partially exposed and partially developed photoresist produces a plurality of rough textured semi-ellipsoidal recess arrays in the aluminum copper layer.

8. The method of claim 7 wherein said rough textured semi-ellipsoidal array of recesses increases surface area for wire ball bonding.

9. The method of claim 7 wherein said rough textured semi-ellipsoidal array of recesses provides a mechanical interlock bond between a wire ball and bond pad.

* * * * *